US005570312A

United States Patent [19]

Fu

[11] Patent Number: 5,570,312
[45] Date of Patent: Oct. 29, 1996

[54] SRAM CELL USING WORD LINE CONTROLLED PULL-UP NMOS TRANSISTORS

[75] Inventor: Chien-Chih Fu, Hsinchu, Taiwan

[73] Assignee: United Microelectronics Corporation, Hsin-Chu, Taiwan

[21] Appl. No.: 488,705

[22] Filed: Jun. 9, 1995

Related U.S. Application Data

[63] Continuation of Ser. No. 215,461, Mar. 21, 1994, abandoned.

[51] Int. Cl.$^6$ .................................................. G11C 11/00
[52] U.S. Cl. .......................................... 365/154; 365/190
[58] Field of Search .................................. 365/154, 156, 365/190, 202

[56] References Cited

U.S. PATENT DOCUMENTS

| | | | |
|---|---|---|---|
| 4,524,377 | 6/1985 | Eguchi | 257/49 |
| 4,525,811 | 6/1985 | Masuoka | 365/154 |
| 4,901,279 | 2/1990 | Plass | 365/154 |
| 5,051,951 | 9/1991 | Maly et al. | 365/154 X |
| 5,198,683 | 3/1993 | Sivan | 257/67 |

FOREIGN PATENT DOCUMENTS

| | | | |
|---|---|---|---|
| 54-48131 | 4/1979 | Japan | 365/154 |

*Primary Examiner*—Joseph A. Popek
*Attorney, Agent, or Firm*—William H. Wright

[57] ABSTRACT

An static storage cell has 6 FETs, all of the same type. The cells are arrayed in columns that each have a pair of bit lines and rows that each have a word line. Each side of the cell has a pull down FET and a pull up FET and the two sides are interconnected to form a latch. The two nodes where the drain of one pull down FET and the gate of the other pull down FET are connected to the associated bit line through the associated one of two word pass FETs. The gates of the two pull up FETs and the two word pass FETs are connected to the word line. When the word line receives a selection voltage, the pull up FETs are enabled to conduct at a higher current level and the word pass FETs are enabled to apply the bit voltage to the associated node for a write operation or to apply the node voltage to the bit line for a read operation. At other times, the word pass FETs isolate the cell from the bit lines and the pull up FETs conduct at a sufficient current to maintain the latching operation of the cell.

9 Claims, 1 Drawing Sheet

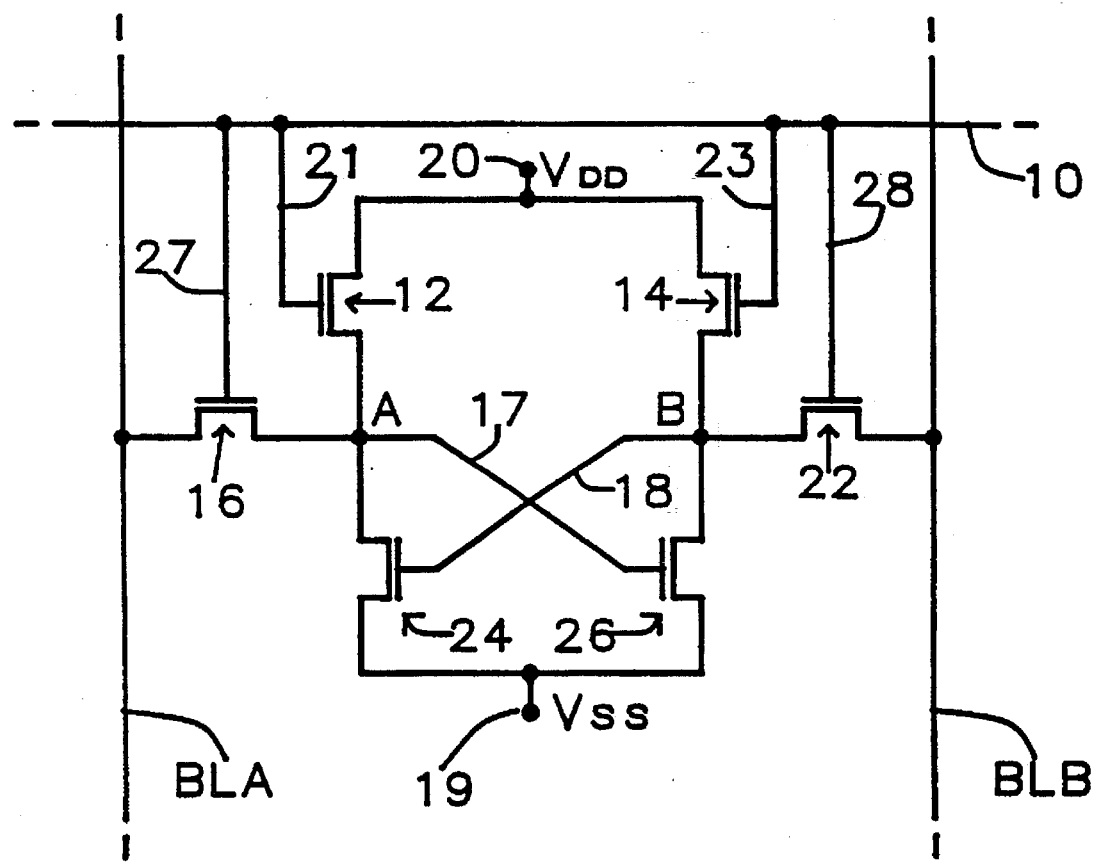

SRAM CELL USING WORD LINE CONTROLLED PULL-UP NMOS TRANSISTORS

RELATED APPLICATIONS

This application is a continuation-in-part of application Ser. No. 08/215,461, filed Mar. 21, 1994, now abandoned.

FIELD OF THE INVENTION

This invention relates generally to static storage devices (SRAMs) and more specifically to an improved storage cell using six FETs.

INTRODUCTION TO STATIC BINARY STORAGE CELLS

Static FET memories are well known, but it will be helpful to review the features and terminology that particularly apply to this invention. The storage cells are arranged in a matrix and are connected to row lines and column lines. The row lines are called word lines because a voltage on a word line selects the cells along the row for a multi-bit read or write operation. The column lines are called bit lines because the cells in a particular column form the corresponding bit position in the memory word. The bit lines carry a data bit from a cell during a read operation and they carry a data bit to the cell on a write operation.

These storage cells each have a latch circuit that stores a binary 0 or 1 by holding one of its two stable states. The latch itself has four FETs, and it will be convenient to think of the latch as having a right side and a left side and a top half and a bottom half.

Each side of the latch commonly has an FET inverter with an FET called a drive transistor or a pull down transistor in the bottom part and a load device such as a resistor or another FET in the top part. The gate of each pull down transistor is connected to the drain of the other pull down transistor, and these two gate/drain nodes form the two input/output nodes of the cell, and they are each connected to an associated one of the two bit lines. Each bit line can be thought of as being connected to the gate of one FET for a write operation and to the drain of the other for a read operation.

In some memories, each cell has two additional FETS that each interconnect an input/output node and its associated bit line. These FETs are called word pass transistors (or "pass transistors"). On a read operation, all of the word pass transistors along a selected row are turned on and the voltage at the two drains of each cell appears on the corresponding pair of bit lines. A sense amplifier detects the difference on the two bit lines and produces a signal representing the 0 or 1 stored by the cell.

On a write operation, a bit driver circuit drives one bit line high and the other bit line low. These bit line voltages appear at the gates of the two FET's of a cell and switch the latch to the selected state. By one convention, when the bit line on the left is high, the pull down transistor on the right is turned on and the cell stores a 1. Conversely, when the bit line on the right is high the cell stores a 0. (The terms "high" and "low" are independent of the polarity of the power supply of an actual circuit.)

THE PRIOR ART

Japanese application 54-48131 shows a cell of the type described with all FETs of the same channel conductivity type but with depletion mode FETs for the pull-up transistors and enhancement mode FETs for the other transistors.

U.S. Pat. No. 4,525,811 in FIG. 1 shows a cell of the type described with pass FETs T3 and T4 with load resistors L1, L2 in the drain circuits of the latch FETs. FIG. 6 shows a CMOS circuit with FETs in place of the load resistors. Their gates are connected to the gate of the associated pull down FET and they turn on and off oppositely to the associated pull down FET.

U.S. Pat. Nos. 5,198,683, 4,524,377 and 5,051,951 show these and other six device FET storage cells.

SUMMARY OF THE INVENTION

It is a general object in this art to reduce the power consumption of a storage cell, commonly by operating the cell at full power for a read or write operation and at low power for a standby operation. It is also a general object in this art to reduce the size and circuit complexity of the cell. The storage cell of this invention achieves these objects.

Another object to provide a new storage cell with FETs instead of resistors in the top of the latch circuit. These FETs will be called pull up FETs. A more specific object is to use FETs of all the same channel conductivity type, preferably n-channel FETs. This structure is simpler to produce, and the cell is smaller as compared with a cell having a p-channel FET in the top and an n-channel FET in the bottom.

In this storage cell, the gates of the pull up FETs are connected to the word line, and the pull up FETs are switched with the word pass FETs. When a cell is selected for a read or write operation, the word line is given a suitable voltage to turn on the two pass FETs and the two pull up FETs. On a write operation, the pass FETs conduct in parallel with the pull up FETs and thereby help switch the latch.

The characteristics of the pull-up and pull-down transistors are different because these transistors have a different function in the operation of the storage cell. In the known prior art, this characteristic has been achieved by making the pull-down transistors enhancement mode and the pull-up transistors depletion mode.

Preferably, as the schematic of the drawing represents, the transistor are all enhancement mode and the desired characterists are achieved in other ways.

When the cell is not selected, the pass FETs turn off, as is conventional, but the pull up FETs are constructed so that they switch to a low conduction state that conserves power but provides enough current to maintain the latch operation. Several circuit techniques that provide this operation will be described.

Other objects and features of the invention will be discussed or evident from the description of a preferred embodiment of the invention.

THE DRAWING

The drawing is a schematic of the preferred storage cell of this invention and its connections to a memory array.

THE PREFERRED EMBODIMENT OF THE INVENTION

The Circuit Schematic

A word line 10 is representative of the word lines of a selected number of rows of a memory array, and the two bit lines BLA and BLB ("bit line A" and "bit line B") are representative of the pairs of bit lines for a selected number of array columns. A suitable driver circuit produces a signal on the word line with binary voltage levels that will be called Select and Not Select. The voltage of the Select and Not Select signals is preferably the same for read and write. The bit line pairs have a sense amplifier for read operations and a bit driver circuit for write operations. These array support circuits are well known and are not shown in the drawing.

The storage cell of the drawing has six FETs: two pull down FETs 24 and 26, two pull up or load FETs 12 and 14, and pass FETs 16 and 22. The FETs can be manufactured in any suitable form but are preferably formed on a polycrystalline silicon thin film. The source terminals of the pull down FETs 24 and 26 are connected to a suitable potential point $V_{SS}$, reference character 19. Lines 17 and 18 cross connect the gates and drain terminals of the pull down FETs to form a latch. The nodes where the gates and drains are connected are designated A and B. FETs 24 and 26 conduct oppositely and during a read operation they pull down one or the other of nodes A or B and thereby produce data signifying voltages at these nodes.

Pull up FETs 12 and 14 connect the drain terminals of the pull down FETs 24 and 26 respectively to a suitable potential point $V_{DD}$, reference character 20. Lines 21 and 23 connect the gates of the pull-up FETs to word line 10, and these FETs turn on in response to the signal Select and they conduct at a low level (as will be explained later) in response to the signal Not Select. The low current level saves power but is sufficient to maintain the state of the latch. When pull up FETs 12 and 14 turn on in response to the signal Select, they supply current either to associated pull down FET 24 or 26, if it is turned on, or to the associated bit line if the pull down FET is turned off.

The Word Pass FETs 16 and 22 connect nodes A and B bilaterally to the associated bit lines BLA and BLB. Lines 27 and 28 connect the gates of the word pass FETs to receive the selection signal on word line 10, and the pass FETs turn on in response to the signal Select and turn off in response to the signal Not Select.

Operation

When the storage cell is selected for a read or write operation, the word line carries a voltage that is suitable to turn on both pull up FETs 12, 14 and both word pass FETs 16, 22.

On a write operation, the word pass FETs give each node A and B substantially the voltage applied to the associated bit line by the bit driver. As is conventional, one bit line is given a suitable voltage to turn on the pull down FET that has its gate connected to the bit line, and the other bit line is given a suitable voltage to turn off the other driver FET. On a read operation, word pass FETs give the associated bit line the voltage of the associated node, A or B, as is conventional.

The Pull Up FETs

The pull up FETs and the pass FETs are constructed so that when the word line carries the Not Select voltage, the pass FETs are turned off to isolate the cell from voltages on the bit lines, but the pull up FETs conduct at level that is sufficient to maintain the latch operation. Stated differently, the turn-off voltage of the pull up FETs is made more negative than the turn off voltage for the word pass FETs. The subthreshold current of the pull up FETs is made greater than the subthreshold current of the pass FETs, and the pull up FETs conduct a subthreshold current during the unselected (standby) operation.

Preferably, as the schematic of the drawing represents, all six transistors are enhancement mode FETs. It has been found that the standby current is smaller when the pull up transistors are enhancement mode, instead of depletion mode as in the prior art.

The threshold voltage of a pull up FET can be made very low so that it becomes a native device (zero threshold voltage).

Preferably the pass FETs are made as narrow and short as possible. The pull down FETs are made large enough for cell operations at a selected speed, as is known. The pull up FETs have a minimum width and are long enough to permit the cell to switch during a write operation. These guides are illustrated by the following table of preferred FET sizes (width/length).

| Pull up FETs 12 and 14 | 0.8/2.0 microns |
|---|---|
| Pass FETs 16 and 22 | 0.6/0.8 microns |
| Pull down FETs 24 and 26 | 2.0/0.6 microns |

Other Embodiments

From the description of preferred circuit, those skilled in the art will recognize modifications of the preferred embodiment within the spirit of the invention and the intended scope of the claims.

I claim:

1. A storage cell for a memory array having a word line (10) for each row of the array, a word driver for each word line, a pair of bit lines (BLA, BLB) for each column of the array, and a sense amplifier and a bit driver for each pair of bit lines, the storage cell comprising first (24), second (26), third (12) and fourth (14) FETs, all of the same channel conductivity type, two input/output nodes (A, B), the first and second FETs being connected with an associated one of the input/output nodes and a first power supply point (19) as pull down FETs and the third and fourth FETs being connected with an associated one of the input/output nodes and a second power supply point (20) as pull up FETs, and means (17, 18) cross connecting the gates and drains of the pull down FETs to form a latch, fifth (16) and sixth (22) FETs of said same channel conductivity type, each connected as a word pass FET between an associated bit line and input/output node for carrying data to the cell on a write operation and receiving data from the cell on a read operation, the first, second, third, fourth, fifth and sixth FETs all being enhancement mode devices, means (27, 28) connecting the gates of the word pass FETs to the associated word line for turning on the word pass FETs when the cell is selected for a read operation or a write operation and turning off the word pass FETs when the cell is not selected, and means (23) connecting the gates of the two pull up FETs to the word line for turning on the pull up FETs when the cell is selected for a read operation or a write operation and to conduct at a low current level sufficient to maintain the latch operation, when the cell is not selected for a read operation or a write operation.

2. The storage cell of claim 1 wherein the FETs are n-channel FETs.

3. The storage cell of claim 1 wherein the pull up FETs operate at a subthreshold current in response to the signal on the word line when the cell is not selected for a read or write operation.

4. The storage cell of claim 3 wherein the subthreshold current of the pull up FETs is larger than the subthreshold leakage current of the pull down FETs to maintain the latch operation when the cell is not selected for a read operation or a write operation.

5. The storage cell of claim 3 wherein the voltage offset of the transistors is in a range beginning with a zero threshold voltage.

6. The storage cell of claim 3 wherein the pull down FETs have reduced subthreshold leakage current compared with the other FETs of the cell.

7. The storage cell of claim 6 wherein the pull up FETs are longer and wider than the pass FETs.

8. The storage cell of claim 6 wherein the pull up FETs are longer and narrower than the pull down FETs.

9. The storage cell of claim 1 wherein the pull up FETs are formed on a polycrystalline silicon thin film.

* * * * *